United States Patent [19]

Nagae et al.

[11] Patent Number: 4,820,650

[45] Date of Patent: Apr. 11, 1989

[54] INTRODUCING LATTICE DEFECT WITH ICE PARTICLES IN SEMICONDUCTOR WAFER

[75] Inventors: Akemi Nagae; Shinichi Satou; Takaaki Fukumoto; Toshiaki Ohmori, all of Hyogo, Japan

[73] Assignee: Mitsubishi Denki Kabushiki Kaisha, Tokyo, Japan

[21] Appl. No.: 121,357

[22] Filed: Nov. 16, 1987

[30] Foreign Application Priority Data

Nov. 14, 1986 [JP] Japan ................................ 61-272153
Mar. 30, 1987 [JP] Japan ................................ 62-79123

[51] Int. Cl.⁴ ........................................ H01L 21/463
[52] U.S. Cl. ...................................... 437/10; 437/11; 437/20; 437/939
[58] Field of Search ...................... 437/10, 939, 11, 20

[56] References Cited

U.S. PATENT DOCUMENTS 3,905,162 9/1975 Lawrence et al. ............... 51/281 SF
4,018,626 4/1977 Schwuttke et al. ...................... 437/9
4,551,744 11/1985 Suzuki .................................... 357/64
4,587,771 5/1986 Buchner et al. ................ 51/281 SF

FOREIGN PATENT DOCUMENTS 3148957 6/1983 Fed. Rep. of Germany ........ 437/10
57-68037 4/1982 Japan ..................................... 437/10
57-145329 9/1982 Japan ..................................... 437/10
60-47427 3/1985 Japan ..................................... 437/10
61-2859 1/1986 Japan .

Primary Examiner—Olik Chaudhuri
Attorney, Agent, or Firm—Lowe, Price, Leblanc, Becker & Shur

[57] ABSTRACT

The invention employs ice for introducing lattice defect into a semiconductor wafer, and is constructed to introduce particles of ice into the semiconductor wafer by ionizing (24) and accelerating (25) the particles of ice, whereby backside damage can be provided on the semiconductor wafer without leaving a pollutant source of the semiconductor wafer.

7 Claims, 3 Drawing Sheets

INTRODUCING LATTICE DEFECT WITH ICE PARTICLES IN SEMICONDUCTOR WAFER

BACKGROUND OF THE INVENTION

1. Field of the Invention

The present invention relates to a process of manufacturing a semiconductor apparatus, and more particularly to an apparatus for introducing lattice defect for gettering of impurity atoms into the back surface of a semiconductor wafer.

2. Description of the Prior Art

Preferably, there are little impurities (such as metals) that are contained in a semiconductor substrate. Therefore, gettering is performed for forming dislocation on the back surface of the semiconductor substrate for capturing the impurities (metals) contained in the whole semiconductor substrate by annealing, thereby to keep the surface of the substrate on which a semiconductor device with less impurities (metals).

A conventional method of gettering used in a process of manufacturing a semiconductor device comprises, for example, a method of backside damage to introduce lattice defect into the back surface of a semiconductor wafer such as silicon and the like. This method provides backside damage, thereby to form a gettering layer 4 as a lattice defect layer, by brushing the back surface of a semiconductor wafer 2 or by causing particles (a particulate diameter of about 10 $\mu$m 3 to impinge upon the same by means of a quartz brush or $SiO_2$-particle jetting equipment 1, as illustrated schematically in FIG. 1.

The conventional method of providing backside damage as described above involved a problem that particles and fragments of the jetted $SiO_2$ or worn particles of the quartz brush are left, which will become a pollutant source of a wafer in a subsequent process.

SUMMARY OF THE INVENTION

The problem as described above can be solved by employing a means for providing backside damage without leaving a pollutant source of a wafer, and more specifically by employing an apparatus for introducing lattice defect by means of particles of ice as to be described in the following.

The apparatus for introducing the lattice defect into the back surface of a semiconductor wafer according to the invention comprises means for preparing the particles of ice, means for transferring said particles of ice, discharge means for ionizing the particles of ice, means for accelerating said ionized particles of ice, and means for placing in the path of the accelerated particles of ice a semiconductor wafer on which a lattice defect is to be introduced.

The particles of ice used in the apparatus for introducing the lattice defect in accordance with the invention are produced by the means for preparing the particles of ice, ionized in the discharge means, accelerated in the acceleration means, and caused to impinge upon the back surface of the semiconductor wafer in which the lattice defect is to be introduced.

The apparatus for introducing the lattice defect according to the invention enables the particles of ice to impinge upon the back surface of the wafer with great energy produced by ionization and acceleration of the particles of ice. For this reason, the apparatus for introducing the lattice defect has the effect that a pure, denser, and deeper backside damage can be provided on the back surface of the wafer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
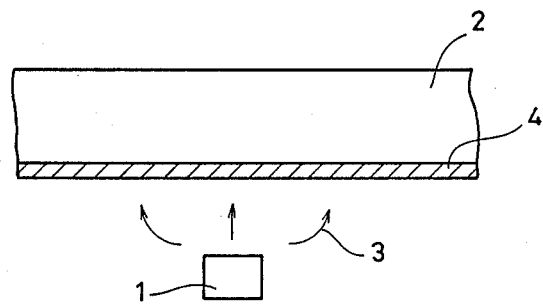
FIG. 1 is a schematic view illustrating a conventional method of introducing lattice defect into the back surface of a semiconductor wafer.

Referring now to the drawings, one embodiment of the invention will be described in the following.

First of all, a basic concept about the invention will be discussed with reference to FIG. 2. An apparatus for providing the backside damage to introduce lattice defect into the back surface of a semiconductor wafer is illustrated schematically in FIG. 2. Numeral 2 denotes a semiconductor wafer, numeral 4 denotes backside damage, numeral 11 denotes an ice freezing container, numeral 12 denotes a source of liquid nitrogen, numeral 13 denotes liquid nitrogen, numeral 14 denotes a diffuser, numeral 15 denotes a heat exchanger, numeral 16 denotes a nozzle, numeral 17 denotes a source of pure water, numeral 18 denotes particles of ice, numeral 19 denotes a screw feeder, numeral 20 denotes a hopper, and numeral 21 denotes a blast device.

For example, the container 11 which is 400×400 $mm^2$ in cross section and 1200 mm in height is filled up to 500 mm in height with the liquid nitrogen 13 supplied from the source of liquid nitrogen 12. The liquid nitrogen ($LN_2$)13 generates a wave having wavelength of several mms. on the surface thereof by flowing nitrogen gas ($GN_2$) from the diffuser 14 at the rate of 300 l/min. This nitrogen gas is supplied through the heat exchanger 15 from the source of liquid nitrogen 12. On the other hand, the nozzle 16 provided on the top of the container 11 is supplied with pure water from the source of pure water 17 at the pressure of 1.2 kg/$cm^2$G and at the flow rate of 0.1 l/min, while the nitrogen gas is supplied at the pressure of 1.2 kg/$cm^2$G and at the flow rate of 4.5 Nl/min. Then, the pure water is sprayed in a fog manner from the nozzle 16. Thus, the pure water sprayed in a fog manner into the liquid nitrogen 3 changes into fine particles of ice 18 instantly. The particles of ice at the level of about 70 to 80 $\mu$m are obtained under the spraying condition as described above, and the diameters of these fine particles of ice can be controlled variously by adjusting the spraying condition of pure water, stay time in the liquid nitrogen, and the like.

The particles of ice 18 which are thus produced are transported into the hopper 20, for example, by the screw feeder 19. Then, the particles of ice in the hopper 20 are supplied to the blast device 21. This blast device 21 is, for example, a high pressure gas jetting system, and jets the particles of ice at the rate of 0.3 l/min by the nitrogen gas at the pressure of 5 kg/$cm^2$G and at the flow rate of 1Nm³/min. The backside damage is provided by impingement of this jetted particles of ice upon the back surface of the semiconductor wafer, thereby introducing the lattice defect.

Thus, the particles and worn substances which are the origin of pollutant sources never remain in a subsequent step, since the fine particles of ice are used as impinging particles introducing the lattice defect according to the invention. In addition, the particles of ice produced from the ice whose resistivity is lowered down to lower than 1MΩ·cm by dissolving carbon dioxide gas into ultrapure water may be used. In this case, problems such as the absorption of the pollutant by static electricity at the time of the jetting and impinging will be eliminated, since the water having a low resistance serves to discharge the static electricity.

However, the method described in the foregoing involves a problem that it is difficult to provide a dense and deep backside damage because of the dependence on energy in the particles of ice on the inertia force by a jet of gas in jetting the particles of ice into the back surface of the wafer for providing the backside damage. Thus, the present invention solved the problem as described above by means of the construction of the means for providing the backside damage in the manner described in the following.

Figure 3:
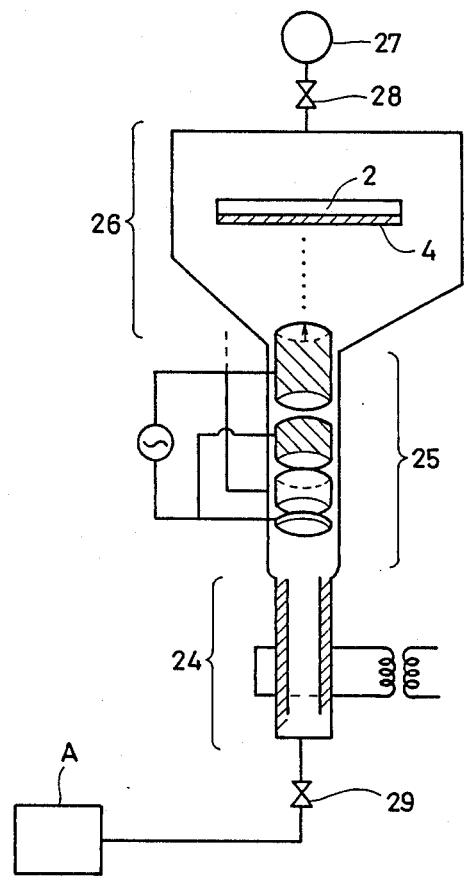
FIG. 3 is a diagram illustrating an apparatus for introducing the lattice defect into the back surface of a semiconductor wafer in accordance with one embodiment of the invention.

Now, one embodiment of the present invention will be discussed with reference to FIG. 3, which schematically shows the device for providing the dense and deep backside damage on the back surface of a semiconductor wafer.

Figure 2:
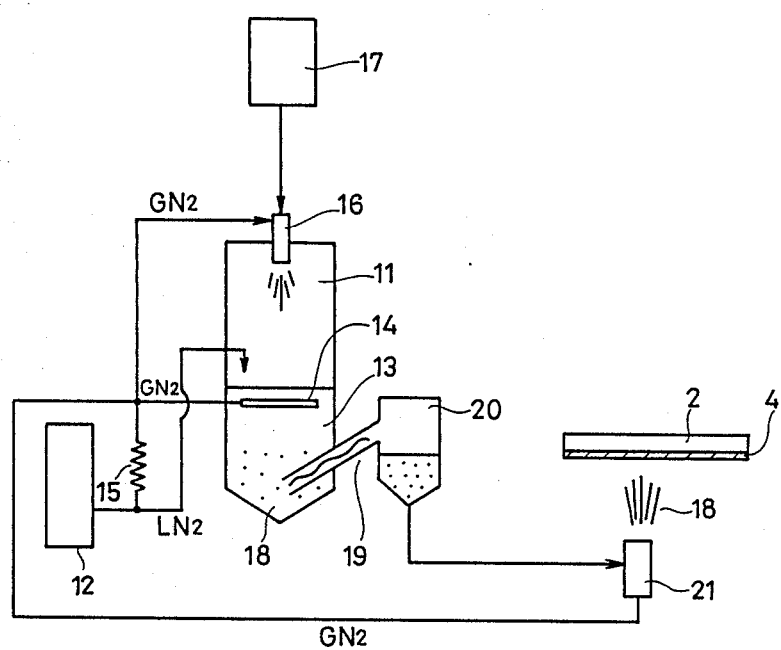
FIG. 2 is a diagram illustrating an apparatus for introducing the lattice defect into the back surface of a semiconductor wafer on the basis of the invention.

A denotes a means for preparing the ice, including the components 11 to 20 shown in FIG. 2, numeral 2 denotes the wafer, numeral 4 denotes the backside damage, numeral 24 denotes a discharge means, numeral 25 denotes an acceleration means, numeral 26 denotes a sample chamber, numeral 27 denotes a pump, and numeral 28 and 29 denote valves.

The operation of the apparatus will be described. Firstly, the valve 28 is opened, and then the discharge means 24, the acceleration means 25, and the sample chamber 26 are brought to a decrease pressure level of 1 to $10^{-6}$ Torr by the pump 27. Then, the valve 29 is opened and the particles of ice within the means for preparing the ice are sucked into the discharge means 24 (e.x. an electron shower device). At this time, a high voltage (50 to 500 V) is supplied to the discharge means, and the particles of ice are ionized and charged by corona discharge. The charged particles of ice are accelerated by the acceleration means 25 and caused to impinge upon the semiconductor wafer 2. The backside damage 4 is provided according to the process as described above. In addition, the acceleration portion 25 is implemented with a plurality of ring-like electrodes, which are switched by a high-frequency a.c.power, and the length of each electrode in the direction of movement of the particles of ice is adjusted to be tunable to the velocity of the particles of ice. Meanwhile, the diameter of the particles of ice used herein is preferably 1 to 50 μm, since damage larger than the silicon dislocation would be caused on the wafer if the diameter of the particles of ice is too large.

A gettering layer can be formed more effectively as a lattice defect layer, by introducing more lattice defect into the back surface of the above described wafer 2 by introducing by ion implantation the impurities such as either elements belonging to any of the groups III, IV, V and VIII or compounds which include them.

Furthermore, not only ion implantation but also the usual method of introducing impurities such as diffusion can be used for introducing said impurities into the back surface of the wafer 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of introducing lattice defect into a back surface of a semiconductor wafer, comprising the steps of;
   preparing particles of ice (A),
   transporting said particles of ice prepared (27),
   ionizing and accelerating said particles of ice (24, 25),
   placing in the path of said accelerated particles of ice said semiconductor wafer into which said lattice defect is to be introduced, so that said accelerated particles of ice impinge upon said semiconductor wafer.

2. A method according to claim 1, which further comprises the step of introducing impurities into said back surface of said semiconductor wafer.

3. A method according to claim 2, wherein said step of introducing the lattice defect into the back surface of the semiconductor wafer comprises the steps of ion implantation.

4. A method according to claim 3, wherein said impurities belong to any of the groups III, IV, V and VIII or a compound which includes any of them.

5. A method according to claim 4, wherein
   said step of preparing said particles of ice comprises the step of preparing a container for holding said particles of ice prepared,
   said step for ionizing and accelerating said particles of ice comprises the step of preparing a container whose pressure can be controllably reduced,
   said means for transporting said particles of ice comprises the steps of:
   setting said container to be the first pressure,
   setting said container to be the second pressure lower than said first pressure, and
   transporting said particles of ice by using the difference between said first pressure and said second pressure.

6. A method according to claim 5, wherein said step of ionizing and accelerating said particles of ice comprises the step of using an electron shower device (24).

7. A method according to claim 6, wherein the particulate diameter of said particles of ice is 1 to 50 μm.

* * * * *